(12) United States Patent
Campbell et al.

(10) Patent No.: US 7,380,409 B2
(45) Date of Patent: Jun. 3, 2008

(54) ISOLATION VALVE AND COOLANT CONNECT/DISCONNECT ASSEMBLIES AND METHODS OF FABRICATION FOR INTERFACING A LIQUID COOLED ELECTRONICS SUBSYSTEM AND AN ELECTRONICS HOUSING

(75) Inventors: Levi A. Campbell, New Paltz, NY (US); Richard C. Chu, Hopewell Junction, NY (US); Michael J. Ellsworth, Lagrangeville, NY (US); Madhusudan K. Iyengar, Rhineback, NY (US); Donald W. Porter, Highland, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 691 days.

(21) Appl. No.: 10/954,792

(22) Filed: Sep. 30, 2004

(65) Prior Publication Data

US 2006/0065874 A1    Mar. 30, 2006

(51) Int. Cl.
- *F25D 23/12*   (2006.01)
- *F28D 15/00*   (2006.01)
- *H05K 7/20*    (2006.01)
- *F16K 31/44*   (2006.01)

(52) U.S. Cl. ............... 62/259.2; 165/80.4; 165/104.33; 251/250; 361/699

(58) Field of Classification Search ............... 62/259.2; 165/80.4, 104.33; 361/699, 701, 831; 251/248, 251/250

See application file for complete search history.

(56) References Cited

U.S. PATENT DOCUMENTS 4,070,003 A    1/1978    Shames et al. .......... 251/149.6

(Continued)

FOREIGN PATENT DOCUMENTS

JP          08170756 A    *    7/1996

OTHER PUBLICATIONS

Chu, et al., "Thermal Dissipation Assembly and Fabrication Method for Electronics Drawer of a Multiple-Drawer Electronics Rack," U.S. Appl. No. 10/675,628, filed Sep. 30, 2003, 22 pgs.

(Continued)

*Primary Examiner*—Marc Norman
(74) *Attorney, Agent, or Firm*—Lily Neff, Esq.; Kevin P. Radigan, Esq.; Heslin Rothenberg Farley & Mesiti, P.C.

(57) ABSTRACT

An isolation valve assembly, a coolant connect/disconnect assembly, a cooled multi-blade electronics center, and methods of fabrication thereof are provided employing an isolation valve and actuation mechanism. The isolation valve is disposed within at least one of a coolant supply or return line providing liquid coolant to the electronics subsystem. The actuation member is coupled to the isolation valve to automatically translate a linear motion, resulting from insertion of the electronics subsystem into the operational position within the electronics housing, into a rotational motion to open the isolation valve and allow coolant to pass. The actuation mechanism, which operates to automatically close the isolation valve when the liquid cooled electronics subsystem is withdrawn from the operational position, can be employed in combination with a compression valve coupling, with one fitting of the compression valve coupling being disposed serially in fluid communication with the isolation valve.

3 Claims, 11 Drawing Sheets

U.S. PATENT DOCUMENTS

| | | | | |
|---|---|---|---|---|
| 4,394,826 A | * | 7/1983 | Van Scoy | 73/861.61 |
| 4,827,977 A | | 5/1989 | Fink, Jr. | 137/614.04 |
| 5,131,859 A | * | 7/1992 | Bowen et al. | 439/194 |
| 6,095,485 A | * | 8/2000 | Lebkuchner et al. | 251/77 |
| 6,714,412 B1 | | 3/2004 | Chu et al. | 361/699 |

OTHER PUBLICATIONS

Parker Hannifin Corporation, "Stratoflex Non-Latching Automatic Self-Sealing Couplings for the Aerospace Industry," Catalog 106-NONLAT, Aug. 1999, 9 pgs.

Comb, J.W., et al., "Processor Cooling Water System With Interlock on Quick Disconnect Coupling," IBM Disclosure No.: PO883-0406, Jun. 1884, 1 pg.

Purcell, J.H., "Quick Disconnect System for Chilled Water System for Data Processor," IBM Disclosure No.: PO885-0233, Sep. 1986, No. 269, 1 pg.

* cited by examiner

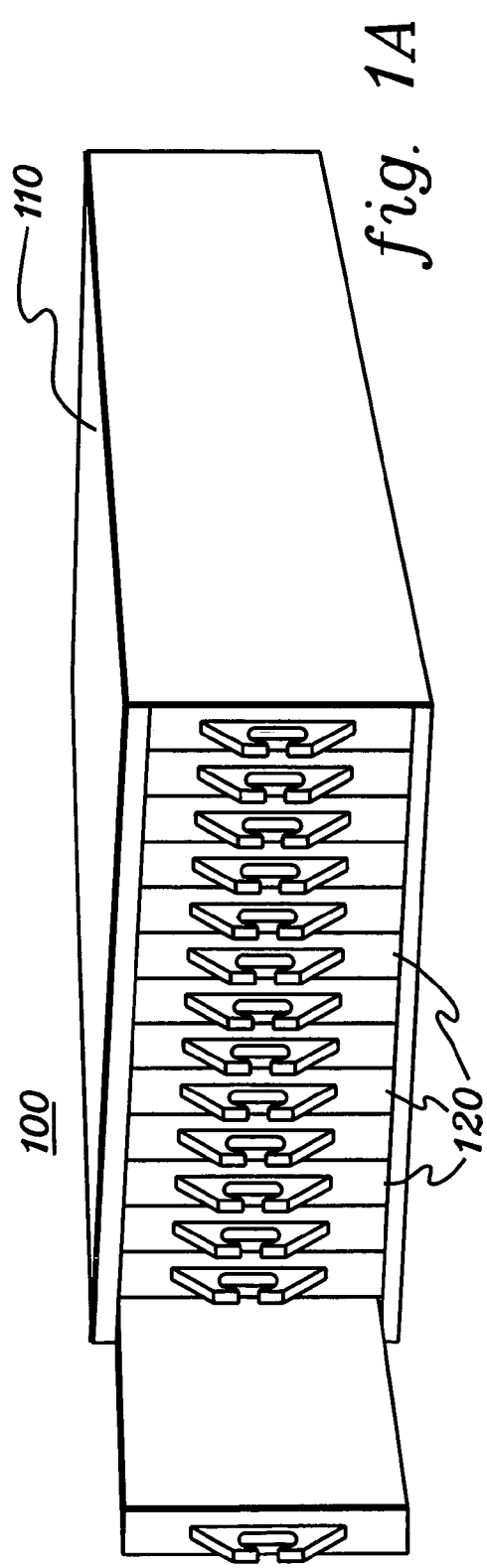
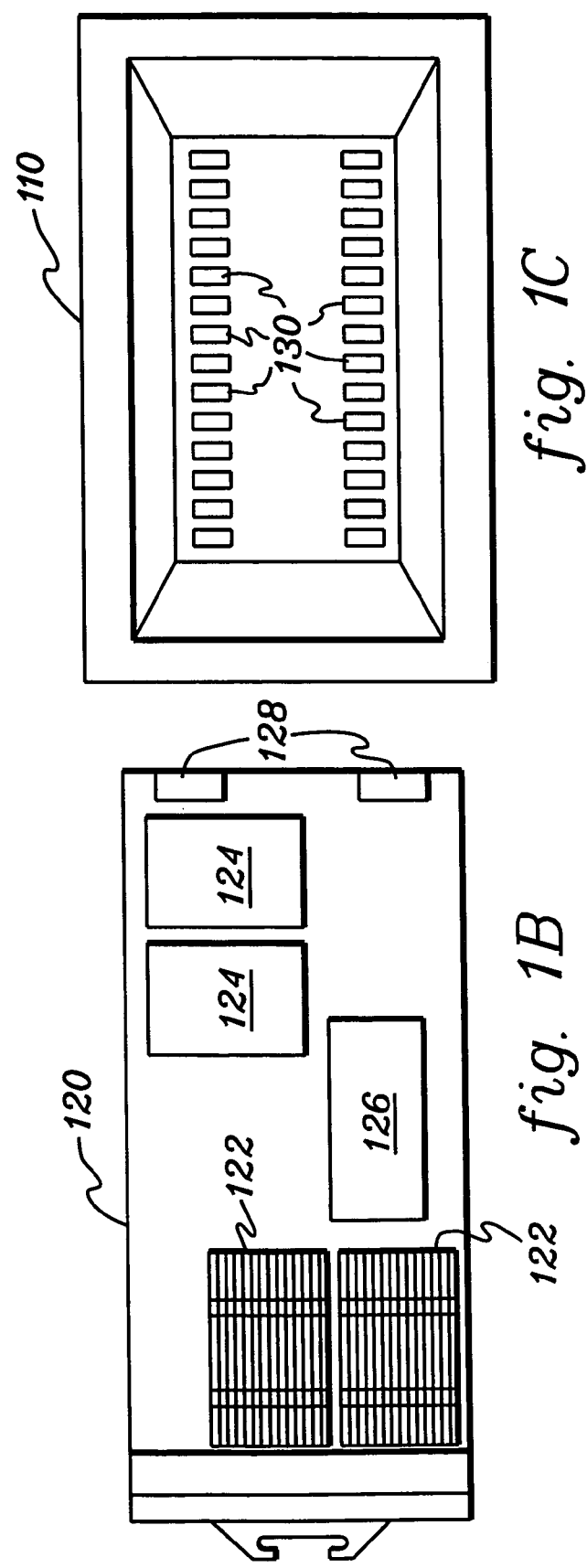
fig. 1A
fig. 1C
fig. 1B

ISOLATION VALVE AND COOLANT CONNECT/DISCONNECT ASSEMBLIES AND METHODS OF FABRICATION FOR INTERFACING A LIQUID COOLED ELECTRONICS SUBSYSTEM AND AN ELECTRONICS HOUSING

TECHNICAL FIELD

The present invention is directed to cooling assemblies and methods for removing heat from electronic devices and modules. More particularly, this invention relates to an isolation valve assembly for use with a liquid cooled electronics subsystem and associated electronics housing which supplies coolant to the liquid cooled electronics subsystem. Still more particularly, this invention relates to an enhanced connect/disconnect assembly for a thermal dissipation assembly extracting heat from heat generating components of an electronics subsystem disposed operationally within an electronics housing.

BACKGROUND OF THE INVENTION

As it is well known, as the circuit density of electronic chip devices increases in order to achieve faster and faster processing speeds, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause of failure of chip devices. Furthermore, it is anticipated that demand for heat removal from these devices will increase indefinitely. Accordingly, it is seen that there is a large and significant need to provide useful cooling mechanisms for electronic circuit devices.

Each new generation of computers continues to offer increased speed and function. In most cases, this has been accomplished by a combination of increased power dissipation and increased packaging density. The net result has been increased heat flux at all levels of packaging. For example, one packaging configuration for certain large computer systems today is a multi-blade server system, with each blade containing one or more processor modules along with associated electronics, such as memory, power and hard drive devices. These blades are removable units so that in the event of failure of an individual blade, the blade may be removed and replaced in the field. One problem with this configuration is that the increase in heat flux at the blade level makes it increasingly difficult to dissipate heat by simple air cooling.

Further, in certain data center equipment, a rack containing blade server systems may house several hundred or more microprocessors, which sharply increases the heat dissipation requirements. These systems place an enormous burden on the facility air conditioning system, since all rack or blade server heat is conventionally dissipated into the room ambient air. These air cooled structures are becoming limited in their thermal performance capability by the modest amount of air flow available for cooling. In addition to this restriction, with projected per rack heat loads to exceed 25 kW in the near future, the burden on the facility air conditioning is very high. Thus, an alternative to the state of the art air cooling is desirable.

SUMMARY OF THE INVENTION

The needs of the prior art are addressed, and additional advantages are provided, by the present invention, which in one aspect is a coolant isolation valve assembly usable with a liquid cooled electronics subsystem which is insertable in an operational position within an electronics housing. The coolant isolation valve assembly includes at least one isolation valve and at least one actuation mechanism. The at least one isolation valve is coupled to at least one of a coolant supply line and a coolant return line providing liquid coolant to the liquid cooled electronics subsystem when operational within the electronics housing. The at least one actuation mechanism is coupled to the at least one isolation valve, and automatically translates a linear motion, resulting from insertion of the liquid cooled electronics subsystem in an operational position within the electronics housing, into a rotational motion to open the at least one isolation valve and allow coolant to pass therethrough. The at least one actuation mechanism operates to automatically close the at least one isolation valve when the liquid cooled electronics subsystem is withdrawn from the operational position within the electronics housing.

In another aspect, a coolant connect/disconnect assembly is provided for a liquid cooled electronics subsystem which is insertable in an operational position within an electronics housing. This coolant connect/disconnect assembly includes a compression valve coupling and an isolation valve assembly. The compression valve coupling includes a first fitting and a second fitting. The first fitting is associated with the liquid cooled electronics subsystem and the second fitting is associated with the electronics housing. The first fitting and the second fitting automatically engage to allow coolant flow therethrough when the liquid cooled electronics subsystem is inserted in the operational position within the electronics housing, and automatically disengage to prevent coolant flow when the liquid cooled electronics subsystem is withdrawn from the operational position within the electronics housing. The isolation valve assembly is disposed within the electronics housing serially and in fluid communication with the second fitting of the compression valve coupling. The isolation valve assembly includes an isolation valve disposed in at least one of a coolant supply line and a coolant return line within the electronics housing, and an actuation mechanism. The actuation mechanism automatically translates a linear motion, resulting from insertion of the liquid cooled electronics subassembly in the operational position within the electronics housing, into motion to open the isolation valve and allow coolant flow therethrough. The actuation mechanism operates to automatically close the isolation valve when the liquid cooled electronics subsystem is withdrawn from the operational position within the housing.

In a further aspect, a liquid cooled electronics system assembly is provided which includes a plurality of electronics subsystems and an electronics housing. The plurality of electronics subsystems are insertable into the electronics housing in an operational position. The assembly further includes a liquid coolant subsystem for providing liquid coolant to at least one electronics subsystem of the plurality of electronics subsystems. The liquid coolant subsystem includes at least one isolation valve assembly having an isolation valve and an actuation mechanism. The isolation valve is coupled to at least one of a coolant supply line and a coolant return line providing liquid coolant to the at least one electronics subsystem when operational within the electronics housing. The actuation mechanism is coupled to the isolation valve and automatically translates a linear motion, resulting from insertion of the at least one electronics subsystem in the operational position within the electronics housing, into a rotational motion to open the isolation valve and allow coolant flow therethrough. The actuation mechanism operates to automatically close the isolation valve when the at least one electronics subsystem is withdrawn from the operational position within the electronics housing.

Methods for fabricating the isolation valve and coolant connect/disconnect assemblies disclosed herein are also described and claimed.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1A depicts one embodiment of a computer blade server system within which a liquid coolant subsystem can be employed, in accordance with an aspect of the present invention;

FIG. 1B depicts a side elevational view of one embodiment of a blade for the blade server system of FIG. 1A;

FIG. 1C depicts an end elevational view of one embodiment of a blade server housing for the blade server system of FIG. 1A, with the multiple blades of the blade server system removed therefrom;

FIG. 8A is an exploded view of the isolation valve assembly of FIG. 8, in accordance with an aspect of the present invention;

BEST MODE FOR CARRYING OUT THE INVENTION

Figure 2:
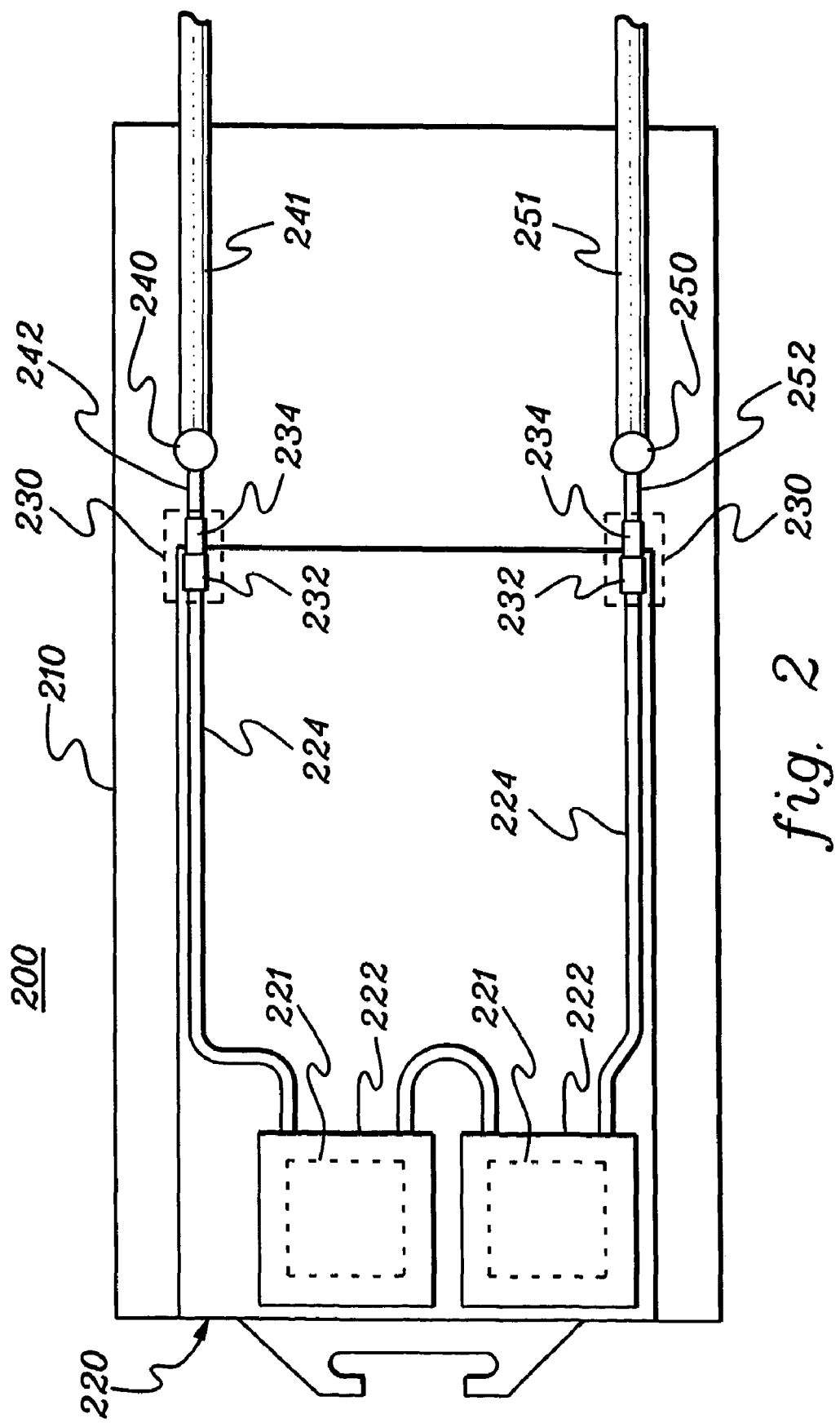
FIG. 2 is a cross-sectional side elevational view of a simplified embodiment of a blade and blade server housing employing a compression valve coupling allowing blind connection of coolant flow paths to provide coolant from the blade server housing to one or more cold plates within the blade, in accordance with an aspect of the present invention.

As used herein "liquid cooled electronics subsystem" refers to any receptacle, compartment, node, book, drawer, blade, etc., containing one or more heat generating components of a computer system or other electronics system employing liquid cooling. The term "electronics module" includes any heat generating component of a computer system or electronics system, and may be, for example, one or more integrated circuit devices, or one or more packaged electronics devices (such as a processor module). The term "electronics housing" includes any frame, rack, chassis, etc. designed to receive one or more liquid cooled electronics subsystems; and may be, for example, a stand alone computer processor having high, mid or low end processing capabilities. In one embodiment, an electronics housing may comprise one or more blade server system chassis, each having one or more blades requiring cooling.

By way of example, various aspects of the present invention are disclosed hereinbelow with reference to a blade server system, one embodiment of which is depicted in FIGS. 1A-1C. The blade server system 100 of FIG. 1A includes an electronics housing or blade server chassis 110 and multiple blades 120 (each comprising one example of an electronics subsystem) which insert into the blade server chassis when in operational position.

FIG. 1B depicts one simplified embodiment of a blade 120. This electronics subsystem includes multiple processors upon which reside respective air cooled heat sinks 122. In this example, each blade is a complete computer system, and includes, for example, DASD 124 and memory chips 126. Electrical connectors 128 are provided for electrically connecting blade 120 to the blade server chassis 110 (FIG. 1C). As shown in FIG. 1C, corresponding electrical connectors 130 are disposed within the blade server chassis for making electrical connection to connectors 128 when the blade is inserted therein in an operational position.

As noted, advances in semiconductor technology have led to exponential increases in microprocessor performance. This has resulted in steep increases in the amount of cooling required to ensure package operation and reliability. In data center equipment, such as racks containing multiple blade server systems, hundreds or even thousands of microprocessors may be placed in close proximity, resulting in significant heat dissipation requirements.

FIG. 1B depicts the conventional use of air cooled heat sinks for the blades of the blade server system. These air cooled heat sinks might include a vapor chamber base to spread heat from the chip package and transfer it, via fins, to the ambient air. Unfortunately, these air cooled structures are limited in their thermal performance capability by the relatively modest amount of air flow available for cooling. In addition, with projected rack heating loads to exceed 25 kW in the near future, the burden on facility air conditioning continues to grow, particularly when a facility contains a large number of blade server systems. Thus, as an alternative, liquid coolant based solutions are believed to be advantageous. Unfortunately, liquid based solutions are accompanied by reliability concerns, and must be designed to be leak-proof. In addition, the customer would require the option of inserting and removing a blade in the field while the system is in operation. Thus, the cooling system also needs to be modular. In addition to the benefits noted, liquid cooling can further reduce device temperature, thus enhancing processor performance.

One technique for providing a modular, liquid cooled electronics subsystem is described in commonly assigned, co-pending U.S. patent application Ser. No. 10/675,628, filed Sep. 30, 2003, entitled "Thermal Dissipation Assembly and Fabrication Method for Electronics Drawer of a Multiple-Drawer Electronics Rack," the entirety of which is hereby incorporated herein by reference. Presented herein below are several alternative coolant subsystem embodiments for a liquid cooled electronics subsystem, which are both modular and highly reliable. The concepts presented are applicable to any type of packaging structure wherein one level of packaging is inserted into a higher level of packaging and where heat dissipation requirements are significant.

FIG. 2 depicts one embodiment of a blade server system 200 having a blade chassis or housing 210 and one or more blades 220 inserted therein. Each blade includes one or more processors 221 over which a respective cold plate 222 is disposed. Cooling liquid flows through appropriate tubing 224 within the blade, and is provided from a facility coolant source passing through manifolds 240 and 250 associated with the electronics housing 210. Self-sealing compression valve couplings 230 include a first fitting 232 and a second fitting 234 between the blade 220 and the housing 210 portions of the coolant supply lines. This allows blade 220 to be removed and returned to the electronics housing without any impact on the liquid cooling circuit. A supply manifold 240 receives liquid coolant from a supply line(s) 241 and provides liquid coolant to the coolant tubing 224 within the respective blade via an inlet coolant line 242. Similarly, an outlet manifold 250 receives system coolant from the coolant tubing of blade 220 via a respective coolant outlet line(s) 252 and discharges the heated coolant from manifold 250 via a return line 251.

The first fitting and second fitting of the compression valve coupling are a blind connect/disconnect coupling which automatically establishes a fluid connection when blade 220 is inserted into an operational position within the electronics housing, and which automatically disengage when the blade is removed from the operational position. By way of example, non-latching, automatic self-sealing couplings are available in the art from Parker Hannifin Corporation of Fort Worth, Tex. Other automatic self-sealing couplings appropriate for use in accordance with the present invention are also commercially available. Preferably, the self-sealing coupling opens and seals automatically as the liquid cooled electronics subsystem is inserted into and is removed from the operational position within the electronics housing. Because of the catastrophic nature of a failure of the second fitting, it is desirable to provide a further guarantee that liquid coolant can not discharge into the housing with withdrawal of an electronics subsystem. This might occur, for example, should a poppet within the second fitting of the compression valve stick, resulting in coolant being discharged into the blade server housing.

Figure 3:
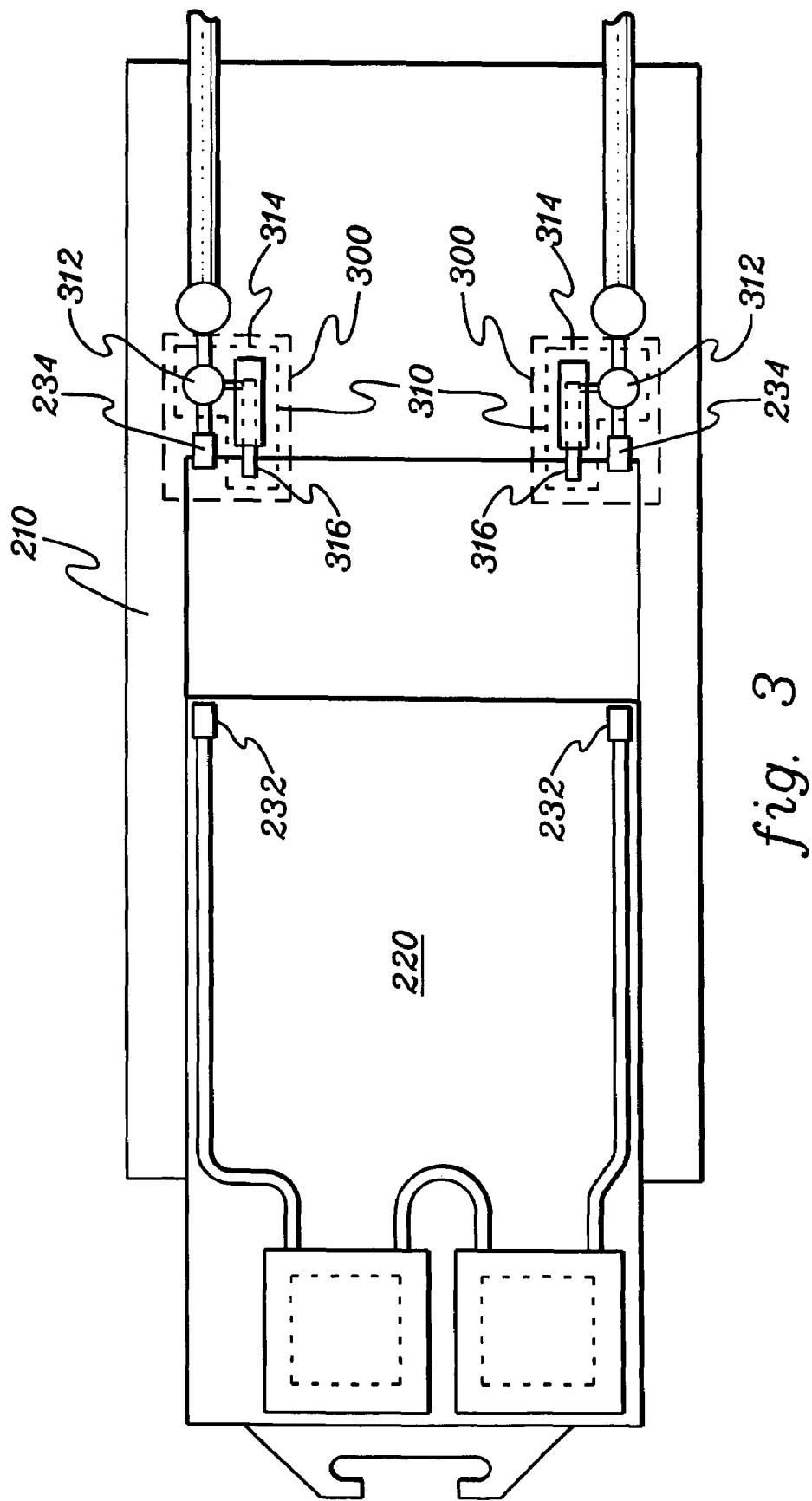
FIG. 3 depicts a cross-sectional side elevational view of one embodiment of a blade server housing showing a blade partially removed, wherein multiple coolant connect/disconnect assemblies are shown each including an isolation valve assembly in series with a compression valve coupling, in accordance with an aspect of the present invention.

FIG. 3 depicts a further embodiment of the present invention wherein a coolant connect/disconnect assembly 300 is employed within the blade server housing 210 on both the coolant supply line and the coolant return line. Each connect/disconnect assembly 300 includes an isolation valve assembly and, for example, the compression valve coupling 230 of FIG. 2. The second fitting 234 of the compression valve coupling again couples to the first fitting 232 associated with the respective removable blade 220 as the blade is brought into or docked in an operable position within the housing.

The isolation valve assembly 310 provides an additional level of coolant isolation protection for the system. In the event of failure of the quick connect coupling, the isolation valve assembly also ensures that coolant will not spray under pressure onto the electronics subsystems. Isolation valve assembly 310 includes an isolation valve disposed within a valve housing 312 and an actuation mechanism 314 coupled to the isolation valve. Actuation mechanism 314 includes a linearly translatable interface member 316, and converts linear movement of member 316 to, for example, rotational movement of the isolation valve. In the embodiment shown in FIG. 3, blade 220 is partially removed from the electronics housing 210 and thus the interface member 316 is shown extended, and the associated isolation valve is closed (see FIG. 6). The second fitting of the compression valve coupling and the isolation valve of the isolation valve assembly are shown in fluid communication and are disposed in series to ensure closing of, e.g., the coolant inlet line and coolant outlet line upon withdrawal of the associated blade from the blade server chassis. The isolation valve assembly could, if desired, also be employed within the individual blades of the blade server system. However, the isolation valve assembly is particularly beneficial on the high pressure side of the compression valve couplings, that is, the blade server chassis side of the coupling. The first fitting 232 in the respective blade is less likely to cause damage since there is less force on that coolant coupling when the blade is removed.

Figure 4:
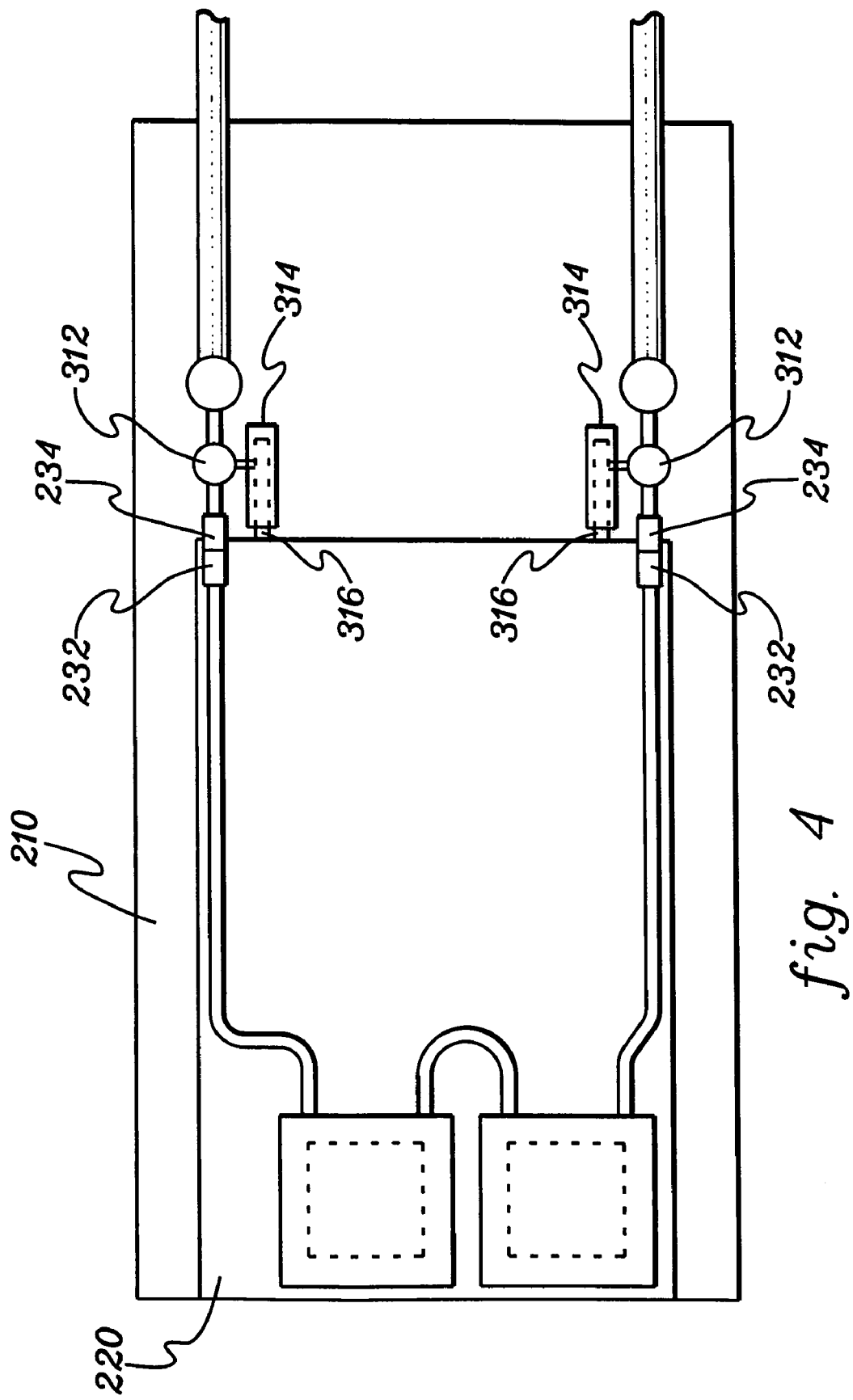
FIG. 4 is a side elevational view of the blade and blade server housing embodiment of FIG. 3 showing the blade in operational position within the blade server housing, and showing the compression valve fittings engaged and the isolation valve assemblies engaged to allow coolant flow therethrough, in accordance with an aspect of the present invention.

FIG. 4 depicts the assembly of FIG. 3 with blade 220 shown in an operational position within blade server chassis 210, and first fitting 232 and second fitting 234 engaged to allow coolant to pass therethrough. In addition, each interface member 316 is translated, resulting in actuation mechanism 314 rotating the respective isolation valve in each isolation valve housing 312 to an open position.

Figure 5:
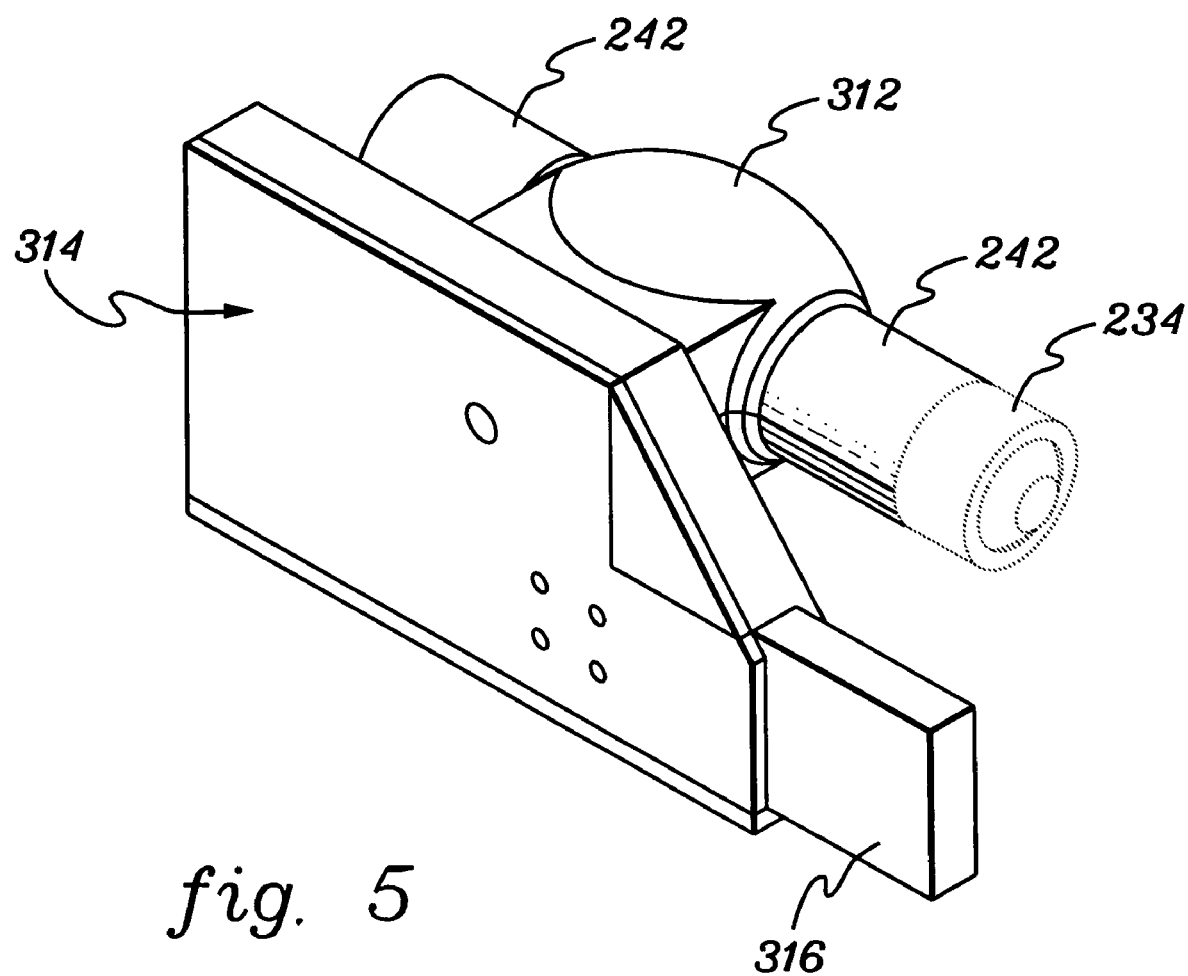
FIG. 5 is an isometric view of one embodiment of an isolation valve assembly, in accordance with an aspect of the present invention.
Figure 6:
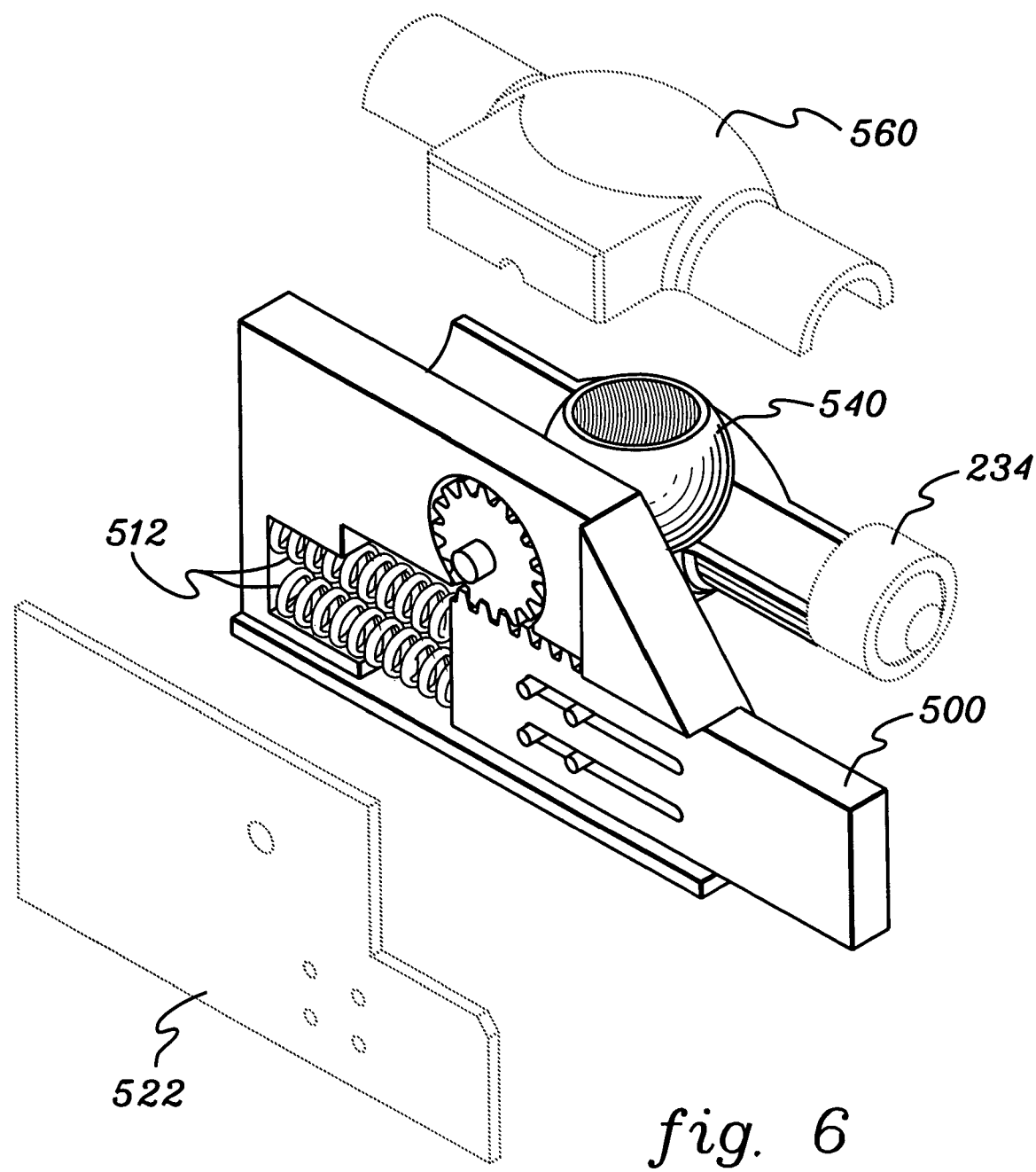
FIG. 6 is a partially assembled isometric view of the isolation valve assembly of FIGS. 5 & 5A showing the ball valve gate in a closed position, in accordance with an aspect of the present invention.
Figure 7:
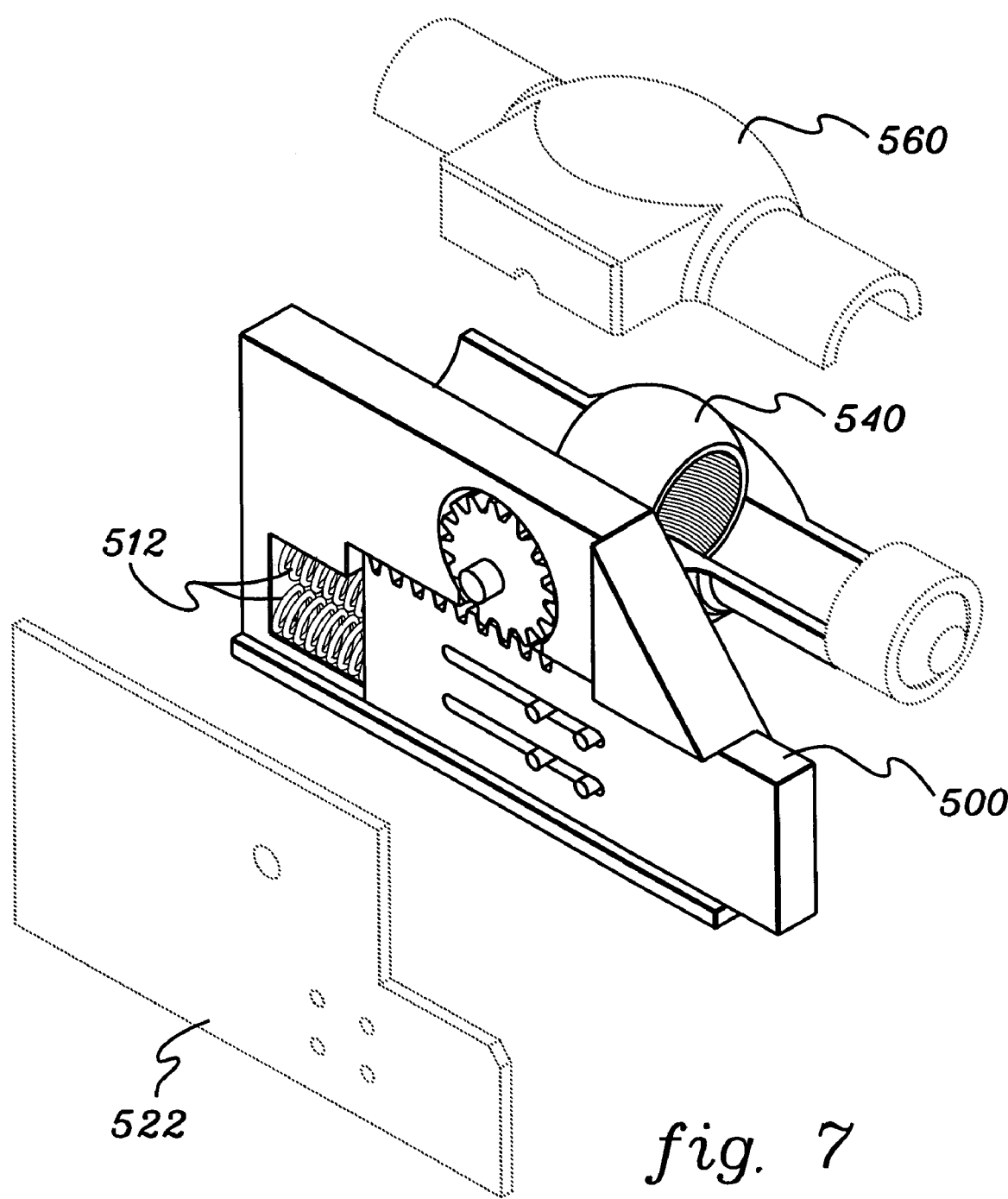
FIG. 7 is a partially assembled isometric view of the isolation valve assembly of FIGS. 5 & 5A showing the ball valve gate in an open position, in accordance with an aspect of the present invention.

One embodiment of an isolation valve assembly 310, in accordance with an aspect of the present invention, is depicted in FIGS. 5-7. In this embodiment, the valve assembly 310 includes a ball valve housing 312 and an actuation mechanism 314 having a linearly reciprocating interface member 316. The ball valve housing 312 is disposed, for example, in series within the inlet line 242 with second compression valve socket 234. This isolation valve assembly provides enhanced shut off actuation upon withdrawal of a blade from the blade server housing. The isolation valve assembly would be mechanically coupled to the blade server housing, while the blade need only have a rigid member aligned to the interface member 316 to present a solid surface to contact the interface member when the blade is inserted into the operational position within the blade server housing. Isolation valve assembly 310 provides a reliable shut off of coolant flow when the blade connection is broken, and a reliable turn on of coolant flow when the blade is reconnected in an operational position.

Figure 5A:
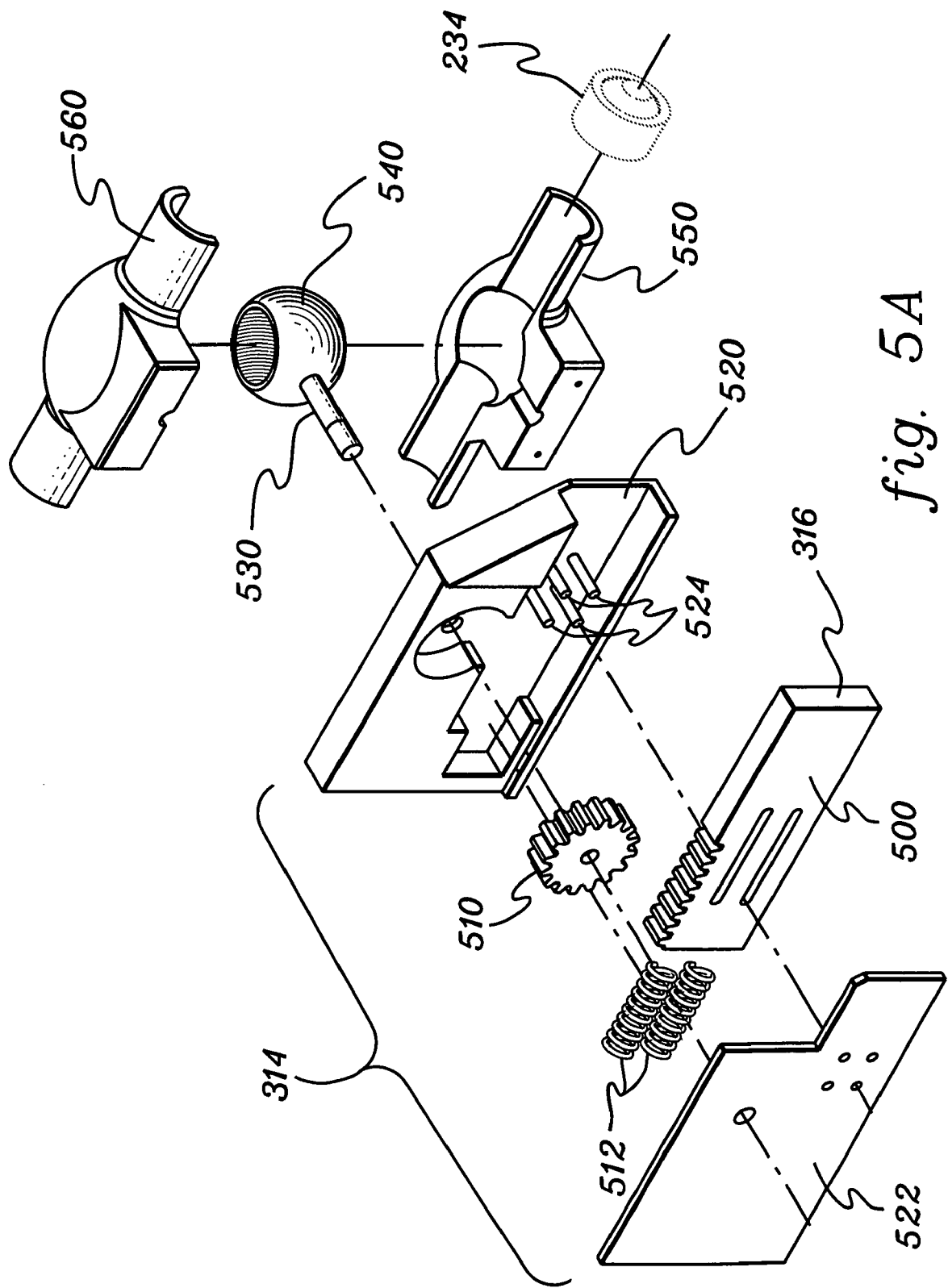
FIG. 5A is an exploded view of the isolation valve assembly of FIG. 5, in accordance with an aspect of the present invention.

FIG. 5A depicts a more detailed embodiment of the isolation valve assembly of FIG. 5. The actuation mechanism 314 includes a rack 500 and pinion gear 510. One end of rack 500 comprises the interface member 316. Rack 500 reciprocates linearly via guide pins 524 and appropriately provided guide pin grooves within the rack. One or more rack return springs 512 are employed to ensure automatic closing of the ball valve gate when the blade is removed from the operational position. The rack and pinion reside between a support block 520 and a cover plate 522. The cover plate, support block, and ball valve housing are, in one embodiment, fastened together rigidly, and the resultant assembly is rigidly fastened to, for example, the blade server chassis. The rack's motion is restrained by the cover plate, guide block, and guide pins.

A shaft 530 connects pinion gear 510 to a ball valve gate 540 (in one embodiment). Gate 540, which resides within a lower ball valve housing 550 and an upper ball valve housing 560, rotates 90° between a closed position and an open position, depending upon whether rack 500 is extended by springs 512 or translated by the associated blade (not shown). The ball valve gate is shown to be in series and in fluid communication with the second fitting or socket 234 of a corresponding compression valve coupling as depicted in FIGS. 3 & 4. In operation, the rack moves laterally when contacted by a respective electronics subsystem, while the rack teeth engage the pinion gear, which rotates the ball valve gate with respect to the ball valve housing by means of the common shaft.

FIG. 6 depicts the isolation valve assembly of FIGS. 5 & 5A with the rack return springs 512 relaxed, the rack 500 extended, and the ball valve gate 540 in a closed position relative to the ball valve housing, i.e., the axis of the center hole in the ball valve gate is rotated perpendicular to the axis of fluid passage in the ball valve housing, thus preventing fluid flow. Cover plate 522 and upper ball valve housing 560 are shown in phantom and exploded view for clarity. The isolation valve assembly depiction of FIG. 6 assumes that the associated blade has been disengaged from the interface member end of rack 500, and is in a non-operational position. In the event of failure of fitting 234, the isolation valve assembly ensures that coolant can not spray under pressure onto the electronics of the blade or the electronics of the blade server chassis. The ball valve body should be coupled to the blade server coolant supply by means of a hose, tube, pipe, etc. As used herein, "facility coolant" or "blade server coolant supply" refers to data center coolant provided through the blade server chassis, and which by way of example, may refer to cooled (and possibly conditioned) water or other coolant.

FIG. 7 again shows the assembled isolation valve assembly of FIGS. 5 & 5A with cover plate 522 and upper ball valve housing 560 exploded and shown in phantom. In this example, rack return springs 512 are compressed by rack 500, which is assumed to be engaging a blade in operational position within the blade server housing. The compressed rack return springs 512 provide the force to return the rack to the extended position and close the valve when the blade is removed. When the rack is compressed as shown, the ball valve gate 540 is in an open position, with the axis of the center opening in the ball valve gate coincident with the axis of the fluid passage in the ball valve body.

Figure 8:
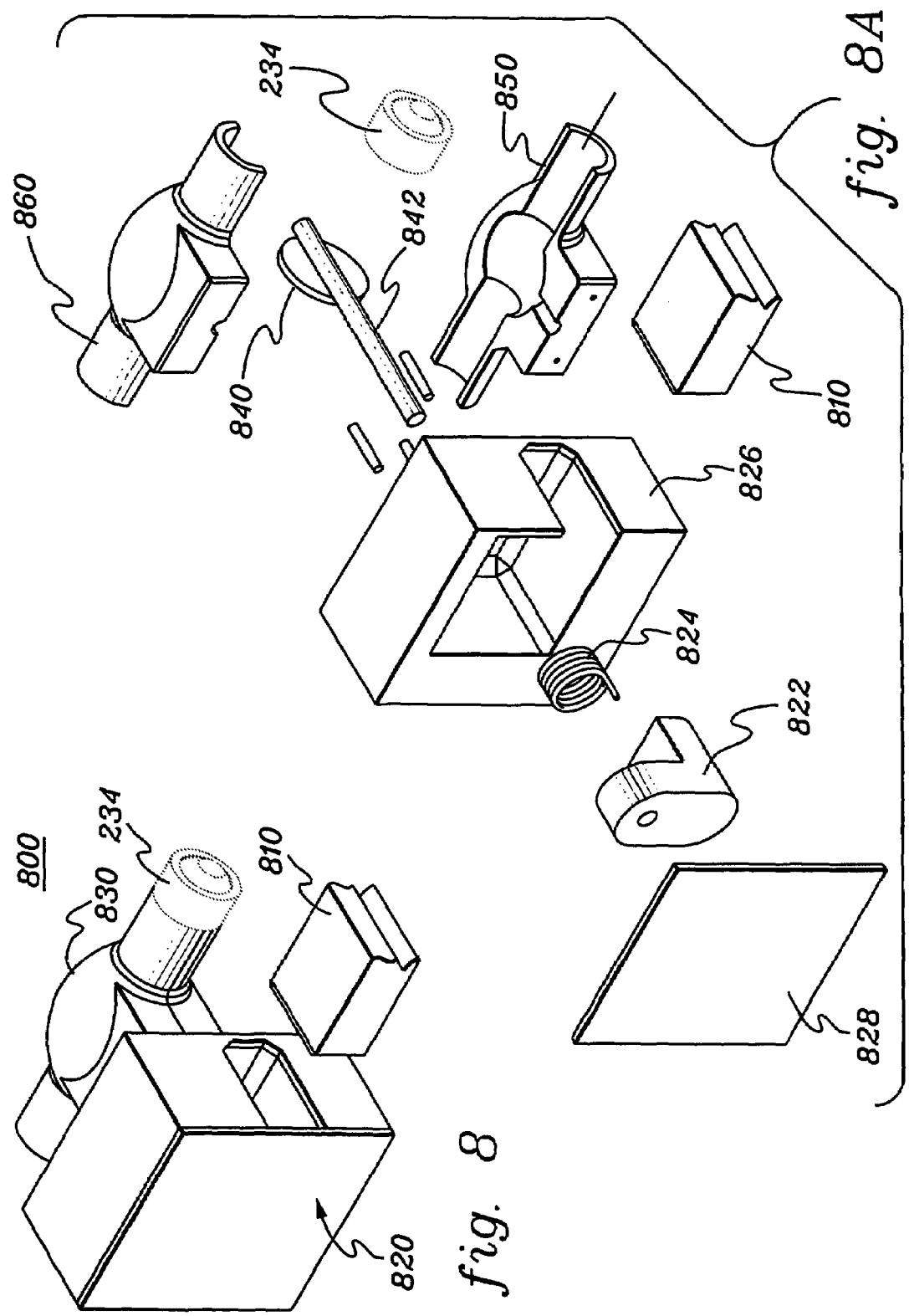
FIG. 8 is an isometric view of another embodiment of an isolation valve assembly, in accordance with an aspect of the present invention.

FIG. 8 depicts an alternate embodiment of an isolation valve assembly, generally denoted 800, in accordance with an aspect of the present invention. Assembly 800 can be used in place of assembly 310 of FIGS. 5-7. In this example, the interface member 810 is assumed to be mechanically connected to or integrated with the blade (not shown). Assembly 800 includes an isolation valve disposed within a housing 830 and an actuation mechanism 820 for translating linear reciprocal motion of interface member 810 to a rotational motion for opening and closing the isolation valve within isolation valve housing 830. The isolation valve is again shown in series and in fluid communication with a second fitting portion 234 of a blind quick connect/disconnect coupling.

FIG. 8A depicts an exploded view of the isolation valve assembly of FIG. 8. As shown, the actuation mechanism includes a structural housing 826 within which is disposed a cam 822 and a cam/valve return spring 824. A cover 828 seals housing 826 except for an appropriately sized opening aligned to receive the reciprocating interface member 810 attached to the associated blade. In this example, cam 822 is mechanically connected via a shaft 842 to a butterfly valve 840. Butterfly valve 840 resides within a lower valve housing 850 and an upper valve housing 860 and is in series and in fluid communication with the second fitting 234 of the blind connect/disconnect coupling.

Figure 9:
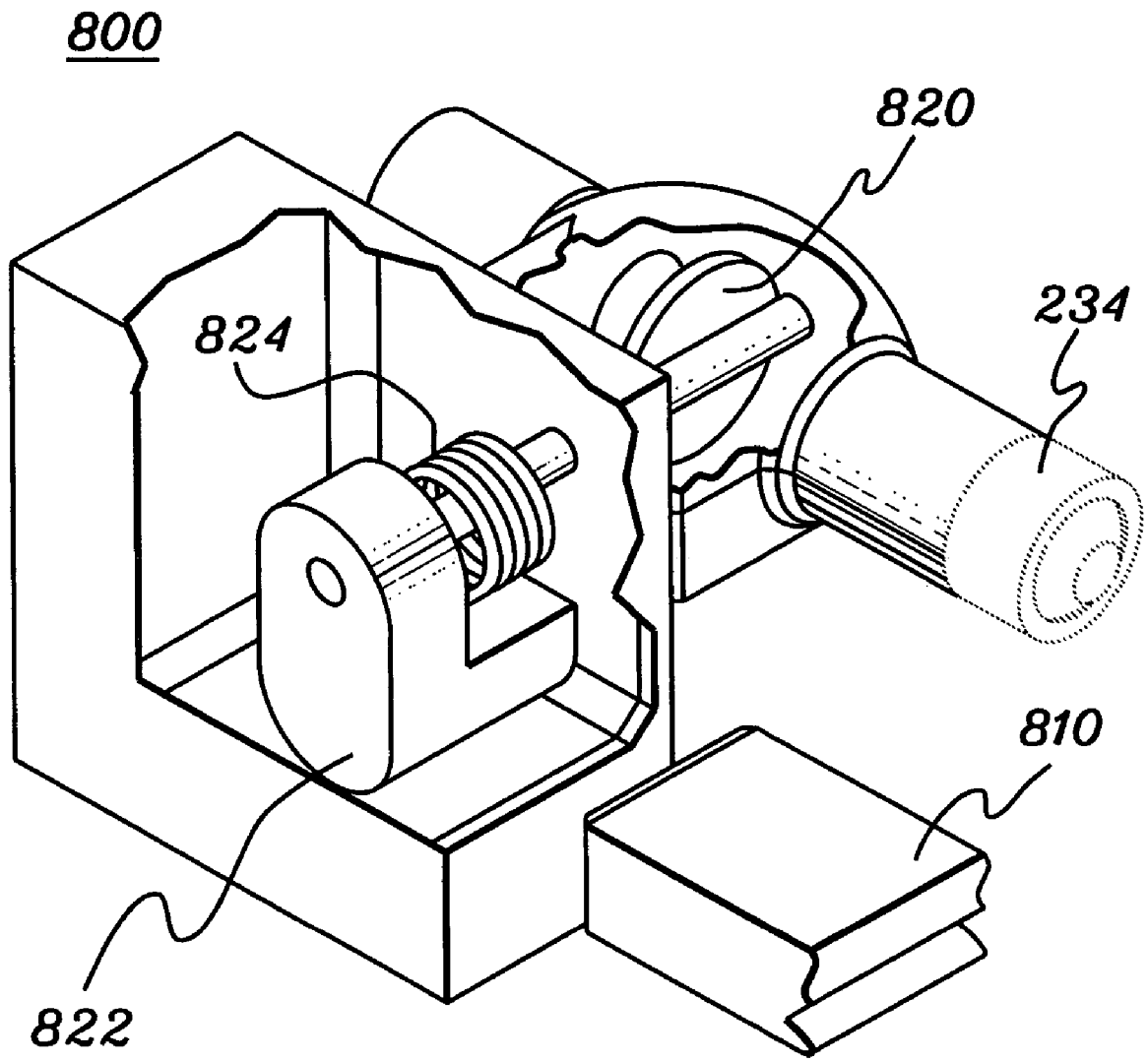
FIG. 9 is a partially cut-away isometric view of the isolation valve assembly of FIGS. 8 & 8A showing the butterfly valve in a closed position, in accordance with an aspect of the present invention.
Figure 10:
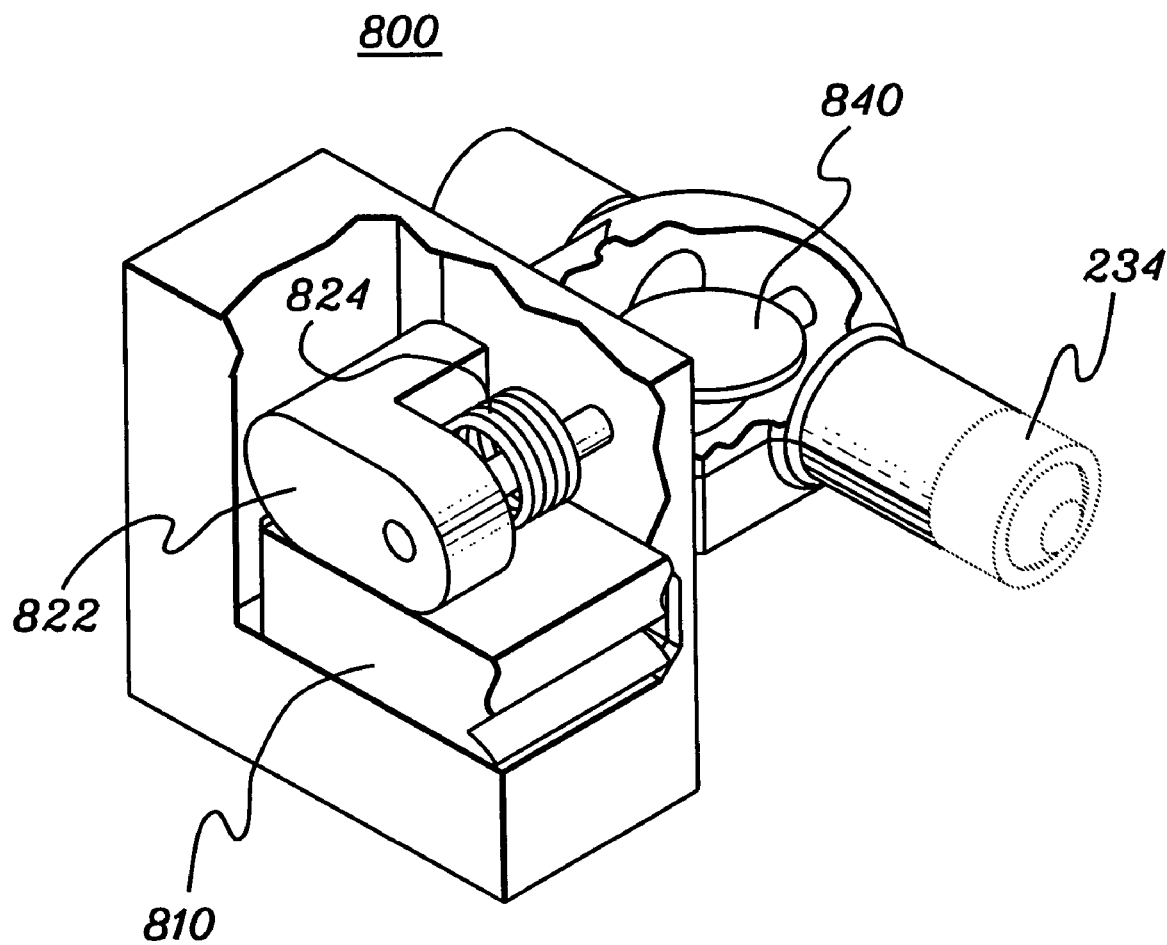
FIG. 10 is a partially cut-away isometric view of the isolation valve assembly of FIGS. 8 & 8A showing the butterfly valve in an open position, in accordance with an aspect of the present invention.

In FIG. 9, the assembled isolation valve assembly 800 is partially broken away to show cam 822 in a neutral position with the cam spring 824 relaxed and the butterfly valve 840 in closed position blocking any coolant flow. In FIG. 10, the interface member 810 is shown engaging cam 822 applying a force to spring 824 resulting in torsional stress on the spring and opening butterfly valve 840. The torsional stress of spring 824 ensures return of cam 822 to the neutral position when the interface member 810 is removed with withdrawal of the blade from an operational position within the blade server chassis.

Those skilled in the art will note from the above discussion that provided herein are an isolation valve assembly, a coolant connect/disconnect assembly, a liquid cooled electronics system assembly, and methods of fabrication thereof, which advantageously allow repeated automatic shut-off and opening of isolation valves associated with a liquid coolant subsystem employed to cool one or more heat generating components of an electronics subsystem which is operable when inserted into an electronics housing. The isolation valve assembly is reusable even after failure of an associated compression valve coupling. Automatic valve shut-off and automatic valve opening are provided via an actuation mechanism which translates a linear movement of the electronics subassembly within the electronics housing to a rotational movement of the isolation valve. Reliable module level and rack level liquid cooling of a plurality of electronics subsystems is facilitated for various electronics systems, such as a single computer or larger computing and data processing equipment. Further, the concepts presented can be employed to design valve shut-off to occur momentarily prior to de-coupling, as well as valve opening to occur momentarily after coupling of the electronics subsystem in an operational position within the electronics housing. This ensures significantly lower pressure on the compression valve coupling fittings at the time of de-coupling and at the time of coupling of the electronics subsystem to the liquid coolant subsystem. The mechanical actuation member of the isolation valve assembly can be separate from the compression valve coupling, and may be positioned within the electronics housing or within the electronics subsystem. A result of this is that the mechanical structure incorporating the compression valve coupling does not need to be located at the point of valve actuation.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a liquid coolant subsystem assembly for a liquid cooled electronics subsystem insertable in an operational position within an electronics housing, the method comprising:
   (i) providing an isolation valve disposed within at least one of a coolant supply line and a coolant return line providing liquid coolant to the liquid cooled electronics subsystem when operational within the electronics housing; and
   (ii) providing an actuation mechanism coupled to the isolation valve, the actuation mechanism automatically translating a linear motion, resulting from insertion of the liquid cooled electronics subsystem in an operational position within the electronics housing, into a rotational motion to open the isolation valve and allow coolant to pass therethrough, and wherein the actuation mechanism operates to automatically close the isolation valve when the liquid cooled electronics subsystem is withdrawn from the operational position within the electronics housing.

2. The method of claim 1, wherein the providing (ii) includes biasing the isolation valve in a closed position and providing an interface member disposed to move linearly as the liquid cooled electronics subsystem is inserted into the operational position within the electronics housing, the actuation mechanism translating the linear movement of the interface member into the rotational motion to open the isolation valve.

3. The method of claim 1, further comprising providing a compression valve coupling including a first fitting and a second fitting, the first fitting being associated with the liquid cooled electronics subsystem and the second fitting being associated with the electronics housing, wherein the first fitting and the second fitting automatically engage to allow coolant flow therethrough when the liquid cooled electronics subsystem is inserted in the operational position within the electronics housing, and wherein the first fitting and the second fitting automatically disengage and prevent coolant flow when the liquid cooled electronics subsystem is withdrawn from the operational position within the electronics housing.

* * * * *